United States Patent
Liu et al.

(10) Patent No.: US 8,395,188 B2
(45) Date of Patent: Mar. 12, 2013

(54) SILICON-GERMANIUM HETEROJUNCTION BIPOLAR TRANSISTOR

(75) Inventors: Donghua Liu, Shanghai (CN); Wensheng Qian, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 24 days.

(21) Appl. No.: 13/271,126

(22) Filed: Oct. 11, 2011

(65) Prior Publication Data
US 2012/0091509 A1   Apr. 19, 2012

(30) Foreign Application Priority Data
Oct. 14, 2010   (CN) .......................... 2010 1 0507418

(51) Int. Cl.
*H01L 29/66* (2006.01)
(52) U.S. Cl. ........ 257/197; 257/183; 257/565; 257/592; 438/312
(58) Field of Classification Search .................... 257/12, 257/197, 198, 573, 578, 584, 587, 575
See application file for complete search history.

(56) References Cited

U.S. PATENT DOCUMENTS

| | | | |
|---|---|---|---|
| 2010/0032804 A1* | 2/2010 | Balster et al. | 257/586 |
| 2011/0147793 A1* | 6/2011 | Chiu et al. | 257/156 |
| 2012/0064688 A1* | 3/2012 | Chen et al. | 438/312 |

* cited by examiner

*Primary Examiner* — Julio J Maldonado
*Assistant Examiner* — Molly Reida
(74) *Attorney, Agent, or Firm* — Blakely, Sokoloff, Taylor & Zafman

(57) ABSTRACT

A SiGe HBT is disclosed. A collector region consists of a first ion implantation region in an active area as well as second and third ion implantation regions respectively at bottom of field oxide regions. Each third ion implantation region has a width smaller than that of the field oxide region, has one side connected to first ion implantation region and has second side connected to a pseudo buried layer; each second ion implantation region located at bottom of the third ion implantation region and pseudo buried layer is connected to them and has a width equal to that of the field oxide region. Third ion implantation region has a higher doping concentration and a smaller junction depth than those of first and second ion implantation regions. Deep hole contacts are formed on top of pseudo buried layers in field oxide regions to pick up collector region.

10 Claims, 5 Drawing Sheets

SILICON-GERMANIUM HETEROJUNCTION BIPOLAR TRANSISTOR

CROSS-REFERENCES TO RELATED APPLICATIONS

This application claims the priority of Chinese patent application number 201010507418.3, filed on Oct. 14, 2010, the entire contents of which are incorporated herein by reference.

TECHNICAL FIELD

The present invention relates to a semiconductor integrated circuit device, and especially to a silicon-germanium heterojunction bipolar transistor (SiGe HBT).

BACKGROUND OF THE INVENTION

Vcesat (collector-emitter saturation voltage) is an important performance parameter of bipolar transistors, which indicates a required Vce (collector-emitter voltage) value for a transistor with a certain collector current to enter the linear region. Therefore, Vcesat has a direct impact on the DC (direct current) power consumption of a transistor when the transistor operates normally. Reducing Vcesat is a necessary means for a transistor to reduce its DC power consumption, and is especially significant for a high-voltage bipolar transistor. For a radio-frequency high-voltage SiGe HBT, in order to maintain a relatively high cut-off frequency at a high breakdown voltage, it is more practical to increase the distance between pseudo buried layers within a transistor and further to increase the breakdown voltage of the transistor through two-dimensional distribution of a depletion region of collector-base junction, rather than only to increase the thickness of a lightly doped collector region. However, the method causes problems that the increase of the lateral size of the lightly doped collector region accordingly increases the series resistance of the collector region, and thus increases the Vcesat. Especially, the lightly doped collector region under a field oxide region is shallow in silicon, which further increases the series resistance and Vcesat.

SUMMARY OF THE INVENTION

An objective of the present invention is to provide a SiGe HBT which can reduce the series resistance of a collector region and the Vcesat of a device.

To achieve the above objective, the SiGe HBT provided by the present invention is formed on a P-type silicon substrate, wherein an active area is isolated by field oxide regions. The SiGe HBT comprises:

A collector region, comprising the first ion implantation region formed in the active area as well as the second ion implantation regions and the third ion implantation regions formed at the bottom of the field oxide regions on both sides of the active area; wherein the first, second and third ion implantation regions are of the first conductivity type; each third ion implantation region is situated on top of each second ion implantation region and is connected to the second ion implantation region; each third ion implantation region has a width smaller than that of each field oxide region and has one side connected to the first ion implantation region; each second ion implantation region has a width equal to that of each field oxide region; each third ion implantation region has a higher doping concentration and a smaller junction depth than those of the first and second ion implantation regions.

Pseudo buried layers, comprising the fourth ion implantation regions formed at the bottom of the field oxide regions on both sides of the active area, wherein the fourth ion implantation regions are of the first conductivity type; each pseudo buried layer is a lateral distance away from the active area and connected to the other side of the third ion implantation region; each pseudo buried layer has a higher doping concentration than each third ion implantation region; each pseudo buried layer situated on top of corresponding second ion implantation region has a junction depth smaller than that of each second ion implantation region, and is connected to the second ion implantation region; a deep hole contact is formed on top of each pseudo buried layer in the field oxide region to pick up an electrode of the collector region.

A base region, comprising a SiGe epitaxial layer of the second conductivity type formed on the silicon substrate; the base region comprising an intrinsic base region which is formed on top of the active area and contacts with the collector region, and extrinsic base regions which are formed on top of the field oxide regions for forming an electrode of the base region.

An emitter region, comprising a polysilicon of the first conductivity type formed on top of the intrinsic base region and contacting with the intrinsic base region.

In one embodiment of the invention, the first and second ion implantation regions are formed by the same ion implantation process, and the process conditions are: implantation dose is from 1e12 to 5e14 $cm^{-2}$ and implantation energy is from 50 to 500 KeV. An ion implantation performed to form the third ion implantation region has following process conditions: implantation dose is from 1e12 to 1e14 $cm^{-2}$ and implantation energy is less than that of the second ion implantation regions.

In one embodiment of the invention, the first and second ion implantation regions are formed by performing an ion implantation simultaneously to the active area covered with a hard mask layer and the bottom of shallow trenches after the shallow trenches are formed and before the field oxide regions are formed. The third ion implantation regions are formed by performing an ion implantation simultaneously to the active area and the bottom of the shallow trenches at an implantation energy level that the hard mask layer will not be penetrated, namely, under the protection of the hard mask layer formed on top of the active area, in the ion implantation process of the third ion implantation regions, the impurity ions are only implanted into the bottom of the shallow trenches rather than the active area. The hard mask layer with a total thickness smaller than 2000 Å has a single-layer structure of silicon oxide or a double-layer structure of silicon nitride and silicon oxide.

In one embodiment of the invention, the fourth ion implantation region of each pseudo buried layer is formed by performing an ion implantation after shallow trenches are formed and before the field oxide regions are formed with following process conditions: implantation dose is from 1e14 to 1e16 $cm^{-2}$ and implantation energy is from 1 to 100 KeV.

In one embodiment of the invention, the SiGe epitaxial layer is doped with an impurity of the second conductivity type by performing an ion implantation with following process conditions: implantation dose is from 1e14 to 1e16 $cm^{-2}$ and implantation energy is from 1 to 50 KeV; germanium has a trapezoidal or triangular distribution.

In one embodiment of the invention, the polysilicon of the first conductivity type in the emitter region is doped by an ion implantation of the first conductivity type performed with following process conditions: implantation dose is from 1e14 to 1e16 $cm^{-2}$ and implantation energy is from 10 to 200 KeV.

In one embodiment of the invention, when the SiGe HBT is a NPN transistor, the first conductivity type of the transistor is N-type and the second conductivity type is P-type; when the SiGe HBT is a PNP transistor, the first conductivity type of the transistor is P-type and the second conductivity type is N-type.

Beneficial effects of the present invention are shown as follows:

1. By arranging the first, second and third ion implantation regions, the collector region of the present invention is divided into a vertical part in the active area and lateral parts at the bottom of the field oxide regions, therefore the depletion region of collector-base junction has a two-dimensional structure, which can increase the breakdown voltage of the transistor and maintain a relatively high cutoff frequency.

2. In the present invention, as the third ion implantation regions have a medium doping concentration which is higher than that of the first ion implantation region, the series resistance of the collector region below the field oxide regions, i.e., the lateral series resistance of the collector region, can be reduced, leading to reduction of the Vcesat of the device.

3. The second ion implantation regions of the present invention increase the junction depths of lateral parts of the collector region in such a way that the junction depths of the second ion implantation regions can be set as same as that of the first ion implantation region, i.e., the vertical part of the collector region, further reducing the lateral series resistance of the collector region.

4. The collector region of the present invention is picked up by heavily doped pseudo buried layers through deep hole contacts, which greatly reduces the collector series resistance compared to an existing diffusion region.

BRIEF DESCRIPTION OF THE DRAWINGS

The present invention will be further described and specified by using figures and implementation details as follows.

DETAILED DESCRIPTION OF THE INVENTION

Figure 1:
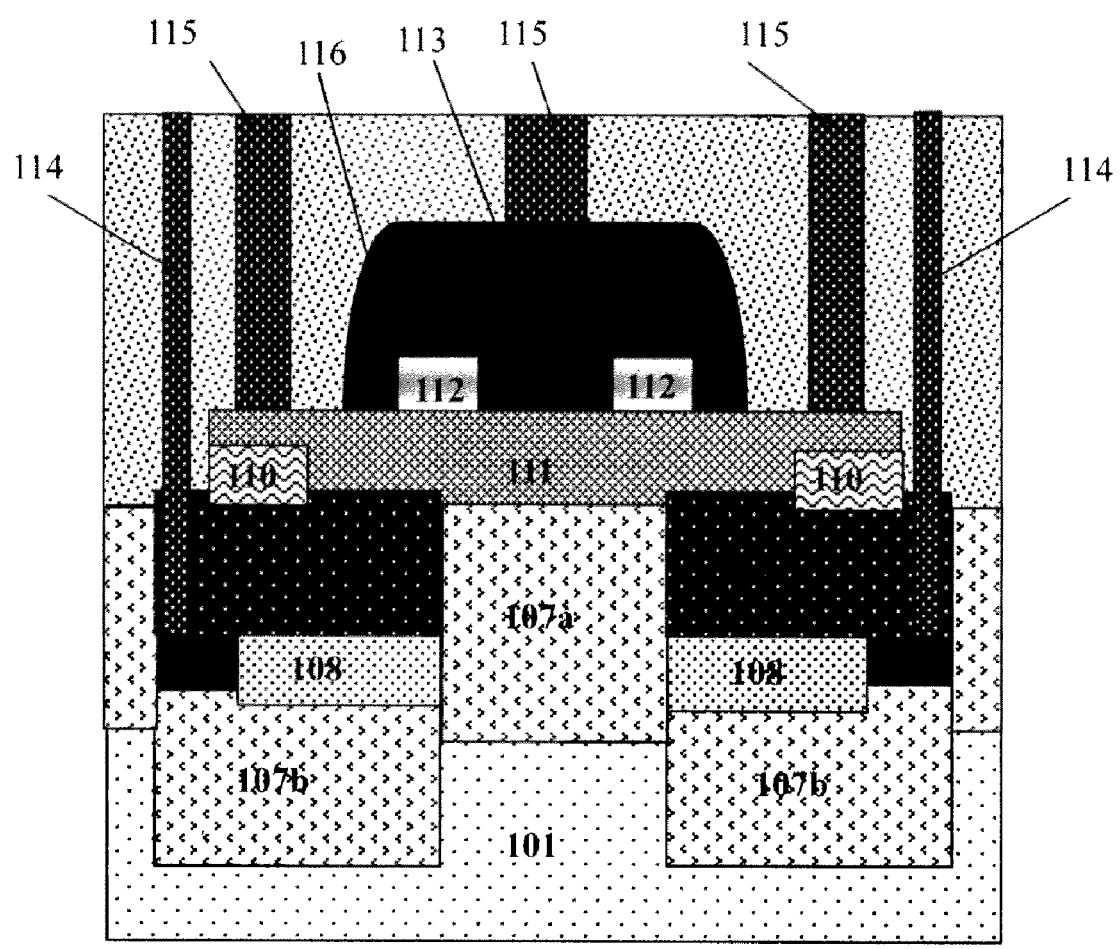
FIG. 1 is a schematic view showing the structure of a device of an embodiment of the present invention.

FIG. 1 is a schematic view showing the structure of a transistor of an embodiment of the present invention. The transistor of the embodiment of the present invention is a SiGe HBT, which is formed on a P-type silicon substrate 101, an active area of which is isolated by field oxide regions 109. The SiGe HBT includes:

A collector region, comprising a first ion implantation region 107a formed in the active area as well as second ion implantation regions 107b and third ion implantation regions 108 formed at the bottom of the field oxide regions 109 on both sides of the active area, wherein the first ion implantation region 107a, second ion implantation regions 107b and third ion implantation regions 108 are all of the first conductivity type; each third ion implantation region 108 is situated on top of the corresponding second ion implantation region 107b and is connected to the second ion implantation region 107b; each third ion implantation region 108 has a width smaller than that of corresponding field oxide region 109, and has one side connected to the first ion implantation region 107a; each second ion implantation region 107b has a width equal to that of corresponding field oxide region 109; each third ion implantation region 108 has a higher doping concentration and a smaller junction depth than those of the first ion implantation region 107a and second ion implantation regions 107b.

The first ion implantation region 107a and second ion implantation regions 107b are formed by performing an ion implantation simultaneously to the active area covered with a hard mask layer and the bottom of shallow trenches, and the ion implantation is performed after the shallow trenches 104 are formed and before the field oxide regions 109 are formed, namely the first ion implantation region 107a and second ion implantation regions 107b are simultaneously formed by the same ion implantation process, wherein the impurity ions of the first ion implantation region 107a are implanted into the silicon substrate 101 through the hard mask layer, while the impurity ions of the second ion implantation regions 107b are directly implanted into the silicon substrate 101 at the bottom of the shallow trenches. The first ion implantation region 107a and second ion implantation regions 107b are formed by the ion implantation process with following process conditions: implantation dose is from 1e12 to 5e14 $cm^{-2}$ and implantation energy is from 50 to 500 KeV. The third ion implantation regions 108 are formed by performing an ion implantation simultaneously to the active area and the bottom of the shallow trenches at an implantation energy level that the hard mask layer will not be penetrated, namely, under the protection of the hard mask layer formed on top of the active area, in the ion implantation process of the third ion implantation regions 108, the impurity ions are only implanted into the bottom of the shallow trenches rather than the active area. The ion implantation for the third ion implantation region has following process conditions: implantation dose is from 1e12 to 1e14 $cm^{-2}$. The hard mask layer with a total thickness smaller than 2000 Å has a single-layer structure of silicon oxide or a double-layer structure of silicon nitride and silicon oxide.

Pseudo buried layers 106, comprising fourth ion implantation regions formed at the bottom of the field oxide regions 109 on both sides of the active area, wherein the fourth ion implantation regions are of the first conductivity type; each pseudo buried layer 106 is a lateral distance away from the active area and is connected to the other side of the third ion implantation region 108; each pseudo buried layer 106 has a higher doping concentration than each third ion implantation region 108; each pseudo buried layer 106 situated on top of corresponding second ion implantation region 107b has a junction depth smaller than that of each second ion implantation region 107b, and is connected to the second ion implantation region 107b; a deep hole contact 114 is formed on top of each pseudo buried layer 106 in the field oxide region 109 to pick up an electrode of the collector region. The fourth ion implantation n of each pseudo buried layer 106 is formed by performing an ion implantation after shallow trenches arc formed and before the field oxide regions 109 are formed with following process conditions: implantation dose is from 1e14 to 1e16 $cm^{-2}$ and implantation energy is from 1 to 100 KeV.

A base region 111, comprising a SiGe epitaxial layer of the second conductivity type formed on the silicon substrate 101; the base region comprises an intrinsic base region which is formed on top of the active area and contacts with the collector region, and extrinsic base regions which are formed on top of the field oxide regions 109 for forming an electrode of the base region. The position and size of the intrinsic base region is determined by a base window, which is located on top of the active area and has a size larger than or equal to that of the active area; the position and size of the base window is defined by a base window dielectric layer 110, which comprises the first layer of a silicon oxide film and the second layer of a polysilicon film, wherein the first layer of the silicon oxide film is formed on the silicon substrate, and the polysilicon film is formed on the first silicon oxide film. The SiGe epitaxial layer is doped with an impurity of the second conductivity type by performing an ion implantation with following process conditions: implantation dose is from 1e14 to 1e16 cm$^{-2}$ and implantation energy is from 1 to 50 KeV; germanium has a trapezoidal or triangular distribution.

An emitter region 113, comprising a polysilicon of the first conductivity type formed on top of the intrinsic base region and contacting with the intrinsic base region. The position and size of the emitter region is determined by an emitter window, which is located on top of the intrinsic base region and has a size smaller than that of the active area; the position and size of the emitter window is defined by an emitter window dielectric layer 112, which comprises the third layer of a silicon oxide film and the fourth layer of a silicon nitride film, wherein the third layer of the silicon oxide film is formed on the SiGe epitaxial layer, and the silicon nitride film is formed on the third layer of the silicon oxide film. The polysilicon of the first conductivity type of the emitter region 113 is doped by an ion implantation of the first conductivity type performed with following process conditions: implantation dose is from 1e14 to 1e16 cm$^{-2}$ and implantation energy is from 10 to 200 KeV.

In the above structure, emitter electrode spacers 116 are formed on both sides of the emitter region 113; the surfaces of both the emitter region 113 and the extrinsic base region are coated by suicide. Each deep hole contact 114 is formed by first forming a deep hole in the filed oxide region 109 on top of the pseudo buried layer 106, and then depositing a titanium/titanium nitride barrier metal layer in the deep hole and filling tungsten into it. Electrodes of the base region 111 and emitter region 113 are respectively picked up through metal contacts 115.

In the above structure, when the SiGe HBT is a NPN transistor, the first conductivity type of the transistor is N-type and the second conductivity type is P-type; when the SiGe HBT is a PNP transistor, the first conductivity type of the transistor is P-type and the second conductivity type is N-type.

Figure 2A:
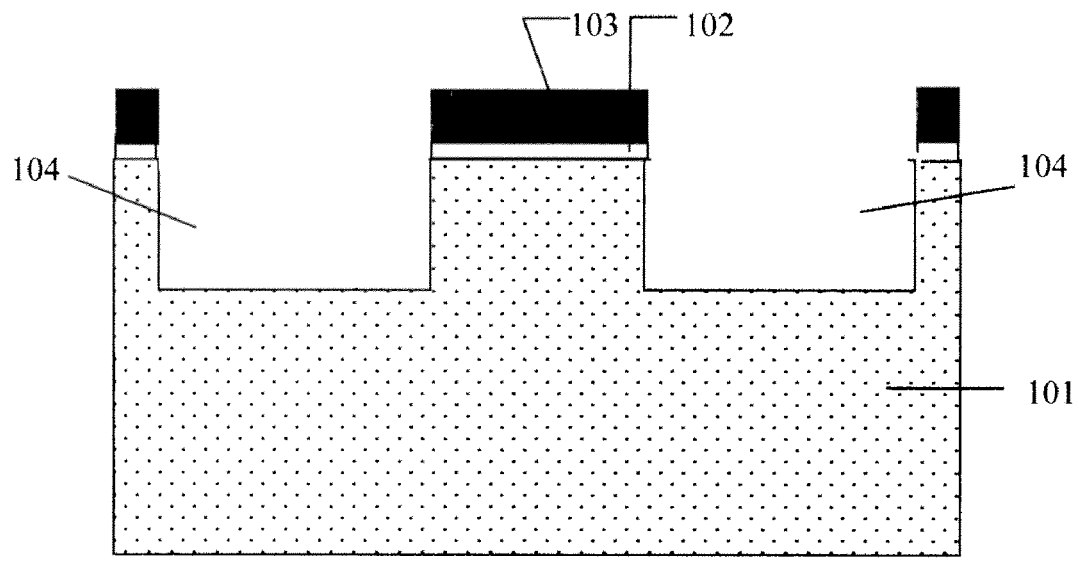
FIG. 2A to FIG. 2G are schematic views showing the structures of the device in steps of the manufacturing method of the embodiment of the present invention.

FIG. 2A to FIG. 2G are schematic views showing the structures of the device in steps of the manufacturing method of the embodiment of the present invention. The manufacturing method of the SiGe HBT of the embodiment of the present invention comprises the following steps:

Step 1: depositing silicon oxide 102 and silicon nitride 103 to form a hard mask layer on a P-type silicon substrate 101, and then forming shallow trenches 104 for field oxide regions 109 by photolithography and etching, as shown in FIG. 2A. Total thickness of the hard mask layer is smaller than 2000 Å.

Figure 2B:
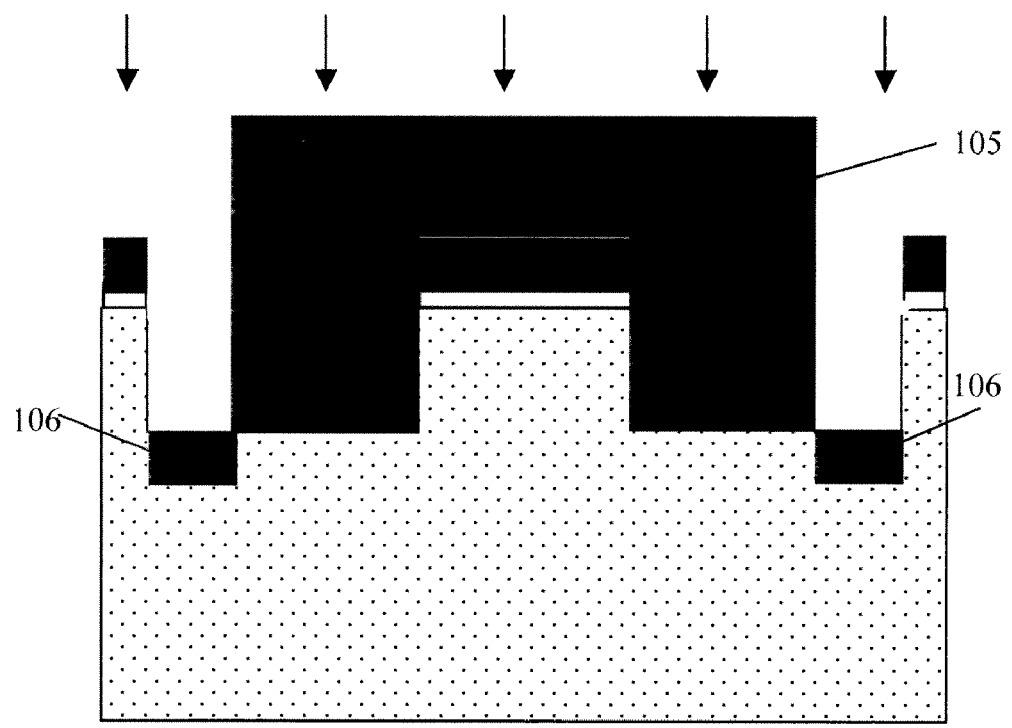

Step 2: defining pseudo buried layer areas by photolithography and then forming pseudo buried layers 106 by implanting large-dose and low-energy ions of the first conductivity type with a mask of photo resist 105, as shown in FIG. 2B. The ion implantation has following process conditions: implantation dose is from 1e14 to 1e16 cm$^{-2}$ and implantation energy is from 1 to 100 KeV.

Figure 2C:
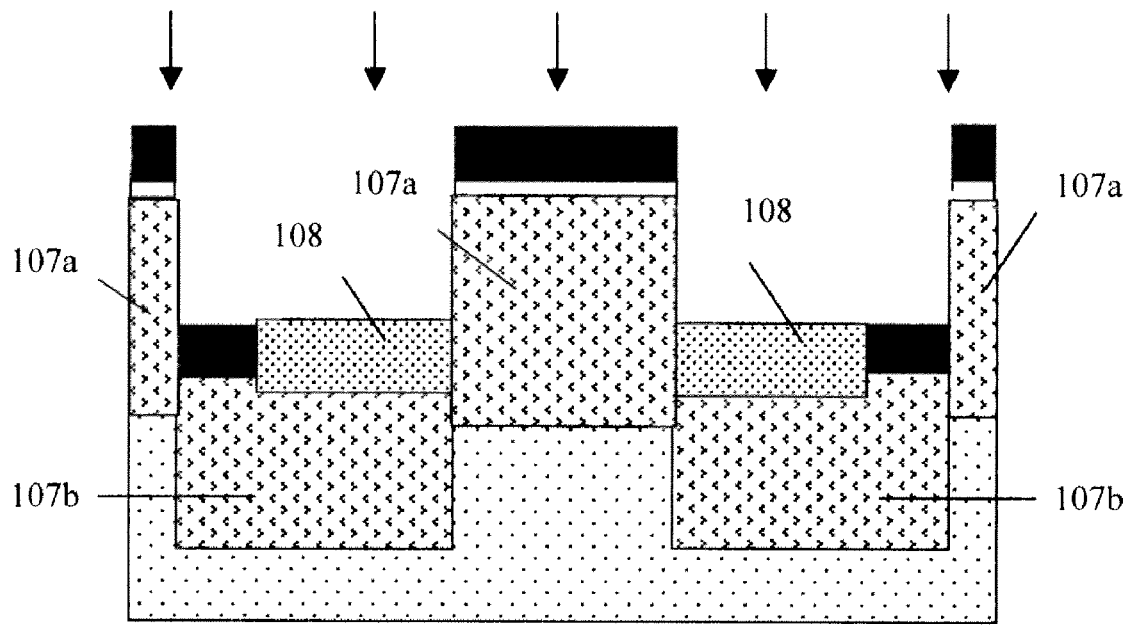

Step 3: forming a collector region of the first conductivity type, which comprises a lightly doped collector region and a moderately doped extrinsic collector region, by performing multiple times of implantations including low-dose high-energy implantations and medium-dose low-energy implantations, to the silicon substrate 101 covered with the hard mask layer for forming the SiGe HBT, as shown in FIG. 2C. The lightly doped collector region comprises a first ion implantation region 107a and second ion implantation regions 107b; the moderately doped extrinsic collector region comprises third ion implantation regions 108. The first ion implantation region 107a and second ion implantation regions 107b are formed by performing an ion implantation simultaneously to the active area covered by the hard mask layer and the bottom of the shallow trenches after the shallow trenches 104 are formed and before the field oxide regions 109 are formed, namely the first ion implantation region 107a and second ion implantation regions 107b are simultaneously formed by the same ion implantation process, wherein the impurity ions of the first ion implantation region 107a are implanted into the silicon substrate 101 through the hard mask layer, while the impurity ions of the second ion implantation regions 107b are directly implanted into the silicon substrate 101 at the bottom of the shallow trenches. The first ion implantation region 107a and second ion implantation regions 107b are formed by the ion implantation process with following process conditions: implantation dose is from 1e12 to 5e14 cm$^{-2}$ and implantation energy is from 50 to 500 KeV. The third ion implantation regions 108 are formed by performing an ion implantation simultaneously to the active area and the bottom of the shallow trenches at an implantation energy level that the hard mask layer will not be penetrated, namely, under the protection of the hard mask layer formed on top of the active area, in the ion implantation process of the third ion implantation regions 108, the impurity ions are only implanted into the bottom of the shallow trenches rather than the active area. The ion implantation for the third ion implantation region has following process conditions: implantation dose is from 1e12 to 1e14 cm$^{-2}$. The hard mask layer with a total thickness less than 2000 Å has a single-layer structure of silicon oxide or a double-layer structure of silicon nitride and silicon oxide.

Figure 2D:
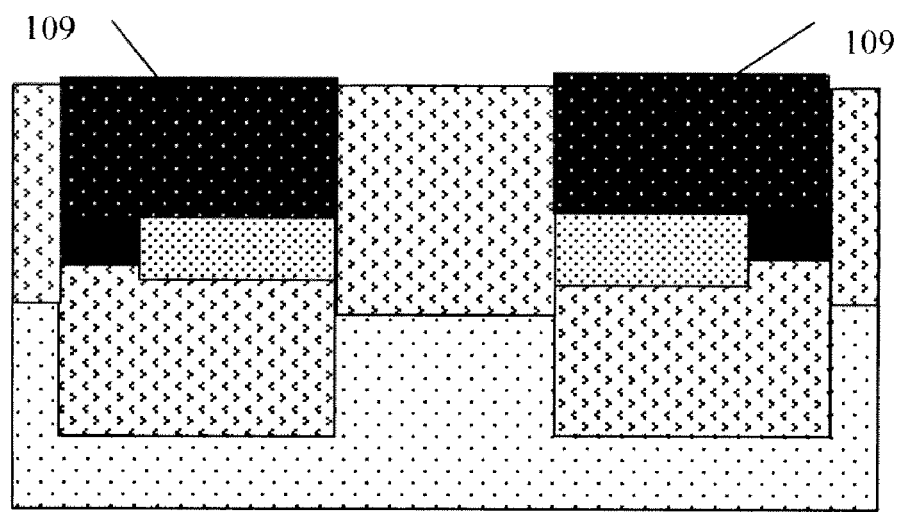
Figure 2E:
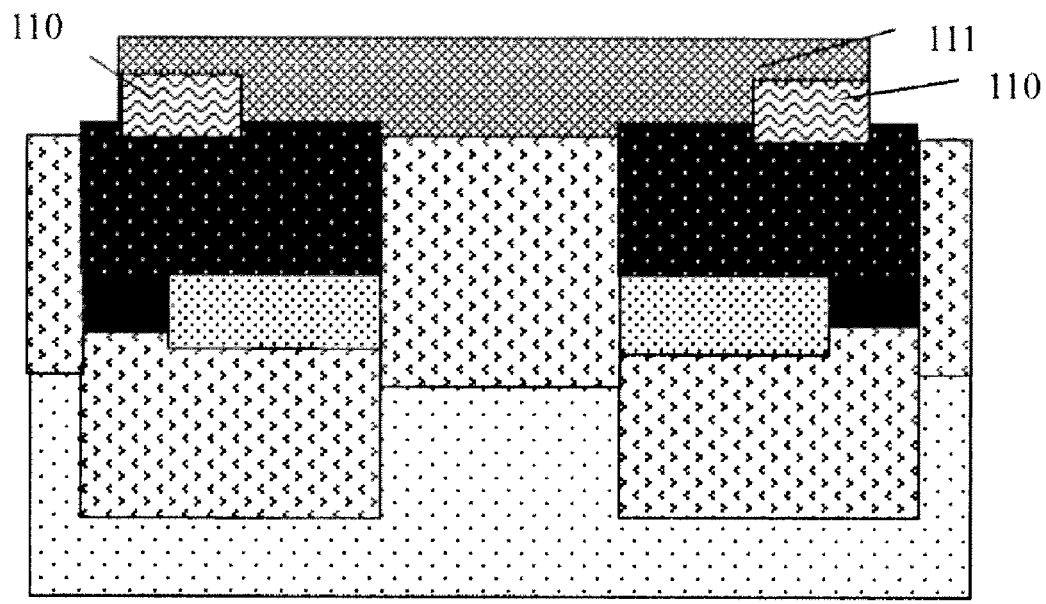

Step 4: forming field oxide regions 109 by depositing field oxides in the shallow trenches 104 and then smoothing the field oxide regions by chemical mechanical polishing, as shown in FIG. 2D, Step 5: depositing a base window dielectric layer 110 which has a single-layer or multilayer structure composed of one or more of silicon oxide, silicon nitride and polysilicon, as shown in FIG. 2E; etching part of the base window dielectric layer 110 to form a base window, which is located on top of the active area and has a size larger than or equal to that of the active area; then forming a base region 111 by growing a SiGe epitaxial layer thin film, in-situ doping an impurity of the second conductivity type in the SiGe epitaxial layer thin film, and then etching the edge parts of both the SiGe epitaxial layer and the base window dielectric layer 110. The base region 111 comprises an intrinsic base region which is formed on top of the active area and contacts with the collector region, and extrinsic base regions which are formed on top of the field oxide regions 109 for forming an electrode of the base region. The SiGe epitaxial layer is doped with an impurity of the second conductivity type by performing an ion implantation with following process conditions: implantation dose is from 1e14 to 1e16 cm$^{-2}$ and implantation energy is from 1 to 50 KeV; germanium has a trapezoidal or triangular distribution.

Figure 2F:
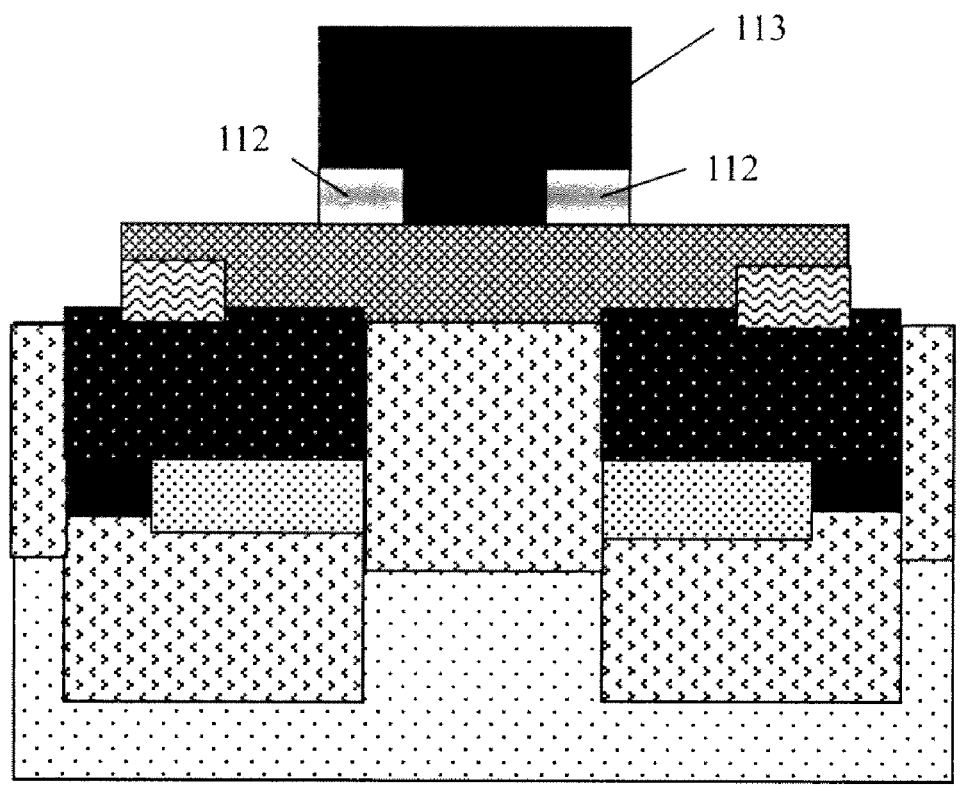

Step 6: depositing an emitter window dielectric layer 112 which has a single-layer or multilayer structure composed of silicon oxide and silicon nitride as shown in FIG. 2F; etching part of the emitter window dielectric layer 112 to form an emitter window, which is located on top of the intrinsic base region and has a size smaller than that of the active area; depositing polysilicon and performing a heavily doped ion implantation with following process conditions: the impurity implanted is of the first conductivity type, implantation dose is from 1e14 to 1e16 cm$^{-2}$, and implantation energy is from 10 to 200 KeV; etching the polysilicon and emitter window dielectric layer 112 to form an emitter region 113; then performing a high-dose ion implantation of the second conductivity type to the extrinsic base region.

Figure 2G:
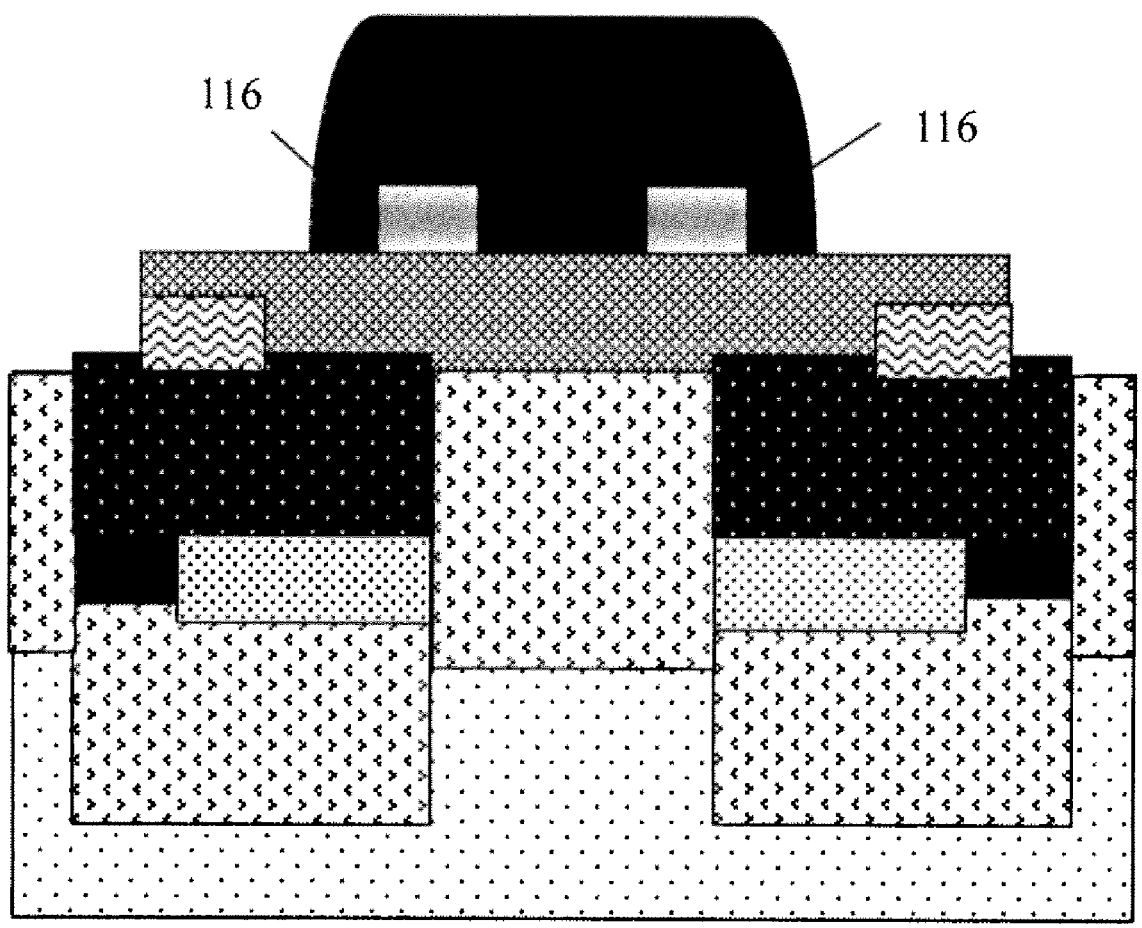

Step 7: forming emitter electrode spacers 116 which are silicon oxide or silicon nitride spacers, as shown in FIG. 2G.

Step 8: forming silicide on the surfaces of the emitter region and the extrinsic base region by self-alignment, as shown in FIG. 2G.

Step 9: forming contact holes and deep contact holes by depositing an intermediate film and etching the intermediate film, as shown in FIG. 1; forming metal contacts 115 of the base and emitter electrodes respectively by filling metal into the contact holes; forming deep hole contacts 114 by depositing titanium/titanium nitride barrier metal layers in the deep contact holes and then filling tungsten into the deep contact holes, wherein the deep hole contacts 114 are in contact with the pseudo buried layers 106 to pick up collector electrodes; then performing back-end processes.

While the present invention has been particularly shown and described with reference to the above embodiments thereof, it will be understood by those skilled in the art that various changes in form and details may be made without departing from the spirit and scope of the invention.

What is claimed is:

1. A silicon-germanium heterojunction bipolar transistor formed on a P-type silicon substrate, wherein, an active area is isolated by field oxide regions, and the silicon-germanium heterojunction bipolar transistor comprises:
    a collector region, comprising a first ion implantation region formed in the active area, second ion implantation regions formed at bottom of the field oxide regions on both sides of the active area, and third ion implantation regions formed at bottom of the field oxide regions on both sides of the active area, wherein the first, second and third ion implantation regions are of a first conductivity type; each third ion implantation region is situated on top of each second ion implantation region and is connected to the second ion implantation region; each third ion implantation region has a width smaller than that of each field oxide region and has one side connected to the first ion implantation region; each second ion plantation region has a width equal to that of each field oxide region; each third ion implantation region has a higher doping concentration and a smaller junction depth than those of the first and second ion implantation regions;
    pseudo buried layers, comprising fourth ion implantation regions formed at bottom of the field oxide regions on both sides of the active area, wherein the fourth ion implantation regions are of the first conductivity type; each pseudo buried layer is a lateral distance away from the active area and connected to the other side of the third ion implantation region; each pseudo buried layer has a higher doping concentration than each third ion implantation region; each pseudo buried layer situated on top of a second ion implantation region has a junction depth smaller than that of each second ion implantation region, and is connected to the second ion implantation region; a deep hole contact is formed on top of each pseudo buried layer in the field oxide region to pick up an electrode of the collector region;
    a base region, comprising a silicon-germanium epitaxial layer of a second conductivity type formed on the silicon substrate; the base region comprising an intrinsic base region which is formed on top of the active area and contacts with the collector region, and extrinsic base regions which are formed on top of the field oxide regions for firming an electrode of the base region;
    an emitter region, comprising a polysilicon of the first conductivity type formed on top of the intrinsic base region and contacting with the intrinsic base region.

2. The silicon-germanium heterojunction bipolar transistor according to claim 1, wherein the first and second ion implantation regions are formed by a same ion implantation process, and the process conditions are: implantation dose is from 1e12 to 5e14 $cm^{-2}$ and implantation energy is from 50 to 500 KeV.

3. The silicon-germanium heterojunction bipolar transistor according to claim 1, wherein an ion implantation performed to form the third ion implantation region has following process conditions: implantation dose is from 1e12 to 1e14 $cm^{-2}$ implantation energy is less than that of the second ion implantation regions.

4. The silicon-germanium heterojunction bipolar transistor according to claim 1, wherein the first and second ion implantation regions are formed by performing an ion implantation simultaneously to the active area covered with a hard mask layer and bottom of shallow trenches after the shallow trenches are formed and before the field oxide regions are formed.

5. The silicon-germanium heterojunction bipolar transistor according to claim 4, wherein the third ion implantation regions are formed by performing an ion implantation simultaneously to the active area and the bottom of the shallow trenches at an implantation energy level that the hard mask layer will not be penetrated.

6. The silicon-germanium heterojunction bipolar transistor according to claim 4, wherein the hard mask layer with a total thickness smaller than 2000 Å has a single-layer structure of silicon oxide or a double-layer structure of silicon nitride and silicon oxide.

7. The silicon-germanium heterojunction bipolar transistor according to claim 1, wherein the fourth ion implantation region of each pseudo buried layer is formed by performing an ion implantation after shallow trenches are formed and before the field oxide regions are formed with following process conditions: implantation dose is from 1e14 to 1e16 $cm^{-2}$ and implantation energy is from 1 to 100 KeV.

8. The silicon-germanium heterojunction bipolar transistor according to claim 1, wherein the silicon-germanium epitaxial layer is doped with an impurity of the second conductivity type by performing an ion implantation with following process conditions: implantation dose is from 1e14 to 1e16 $cm^{-2}$ and implantation energy is from 1 to 50 KeV: germanium has a trapezoidal or triangular distribution.

9. The silicon-germanium heterojunction bipolar transistor according to claim 1, wherein the polysilicon of the first conductivity type in the emitter region is doped by an ion implantation of the first conductivity type performed with following process conditions: implantation dose is from 1e14 to 1e16 $cm^{-2}$ and implantation energy is from 10 to 200 KeV.

10. The silicon-germanium heterojunction bipolar transistor according to the claims 1, wherein when the silicon-germanium heterojunction bipolar transistor is a NPN transistor, the first conductivity type of the transistor is N-type and the second conductivity type is P-type; when the silicon-germanium heterojunction bipolar transistor is a PNP transistor, the first conductivity type of the transistor is P-type and the second conductivity type is N-type.

* * * * *

UNITED STATES PATENT AND TRADEMARK OFFICE
CERTIFICATE OF CORRECTION

PATENT NO. : 8,395,188 B2
APPLICATION NO. : 13/271126
DATED : March 12, 2013
INVENTOR(S) : Donghua Liu and Wensheng Qian Page 1 of 1

It is certified that error appears in the above-identified patent and that said Letters Patent is hereby corrected as shown below:

In the Claims,

Column 8, Claim 3, line 14, please insert --and-- before "implantation".

Column 8, Claim 10, line 58, please delete "to the claims 1" and insert --to claim 1--.

Signed and Sealed this
Twentieth Day of August, 2013

Teresa Stanek Rea
*Acting Director of the United States Patent and Trademark Office*